United States Patent [19]
Kinnard

[11] Patent Number: 6,040,518
[45] Date of Patent: Mar. 21, 2000

[54] WAFER TEMPERATURE MONITORING DEVICE UTILIZING FLEXIBLE THERMOCOUPLE

[75] Inventor: David W. Kinnard, Olney, Md.

[73] Assignee: Eaton Corporation, Cleveland, Ohio

[21] Appl. No.: 09/218,912

[22] Filed: Dec. 22, 1998

[51] Int. Cl.[7] .................................................. H01L 35/34
[52] U.S. Cl. .................... 136/201; 374/179; 374/208; 136/230
[58] Field of Search ............................ 136/230; 374/179, 374/208

[56] References Cited

U.S. PATENT DOCUMENTS

| | | | |
|---|---|---|---|
| 5,106,200 | 4/1992 | Hosokawa | 374/121 |
| 5,315,092 | 5/1994 | Takahashi et al. | 219/497 |
| 5,356,486 | 10/1994 | Sugarman et al. | 136/230 |
| 5,446,824 | 8/1995 | Moslehi | 392/416 |
| 5,567,909 | 10/1996 | Sugarman et al. | 136/230 |

*Primary Examiner*—Kathryn Gorgos
*Assistant Examiner*—Thomas H Parsons
*Attorney, Agent, or Firm*—John A. Kastelic

[57] ABSTRACT

A thermocouple support arm assembly (20) is provided, comprising (i) an arm (28) extending longitudinally along a first axis (X) and having a thermocouple (30) extending therefrom; (ii) an anvil (40) supported by the arm (28) and at least partially occupying a plane defined by a second axis (Y) and a third axis (Z), the anvil positioned below the thermocouple; and (iii) a mounting mechanism (36) for mounting the anvil (40) on the arm (28) such that the anvil (40) is permitted three degrees of rotational freedom with respect to the arm along, respectively, axes X, Y and Z. When a substrate such as a semiconductor wafer is positioned above the thermocouple (30) to at least partially rest upon the thermocouple and the anvil (40), the anvil moves with respect to the arm (28) along the axes (X, Y, Z) to force the thermocouple into contact with the substrate. The thermocouple (30) is constructed of a flexible foil that elastically deforms to conform to the underside of the substrate, when the anvil forces the thermocouple into contact with the substrate, to provide a plurality of contact points (48, 50, 52, 54) between the thermocouple and the substrate. A generally planar shield member may be provided extending from the support arm (28) and located below the anvil (40).

20 Claims, 3 Drawing Sheets

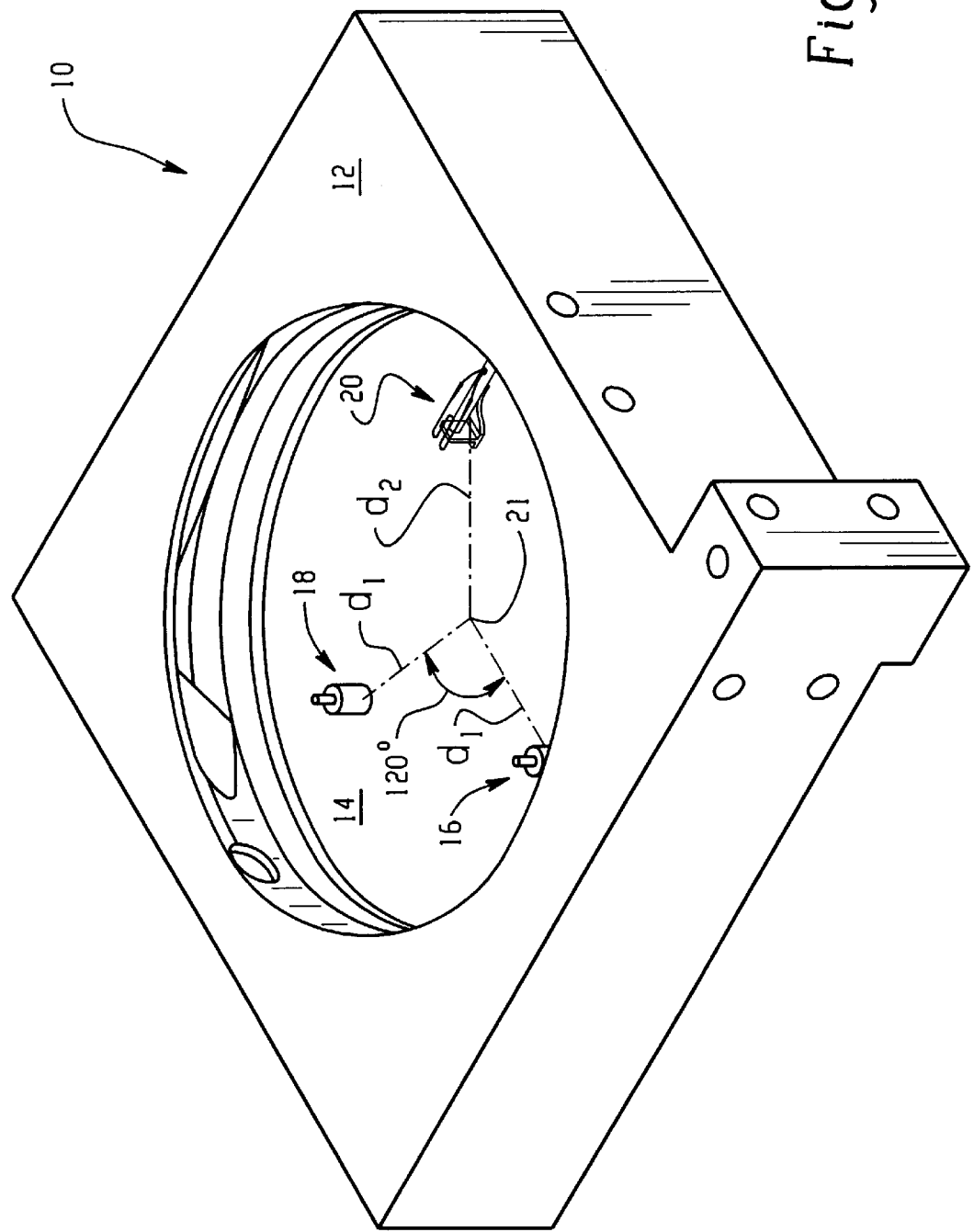

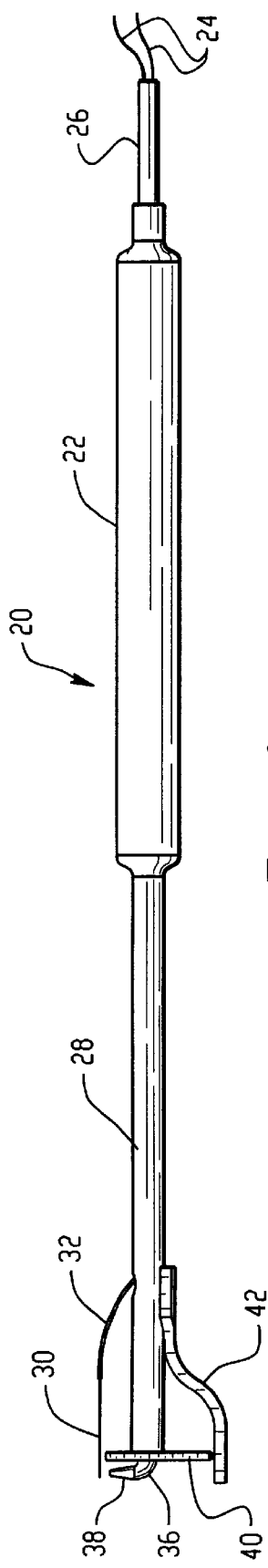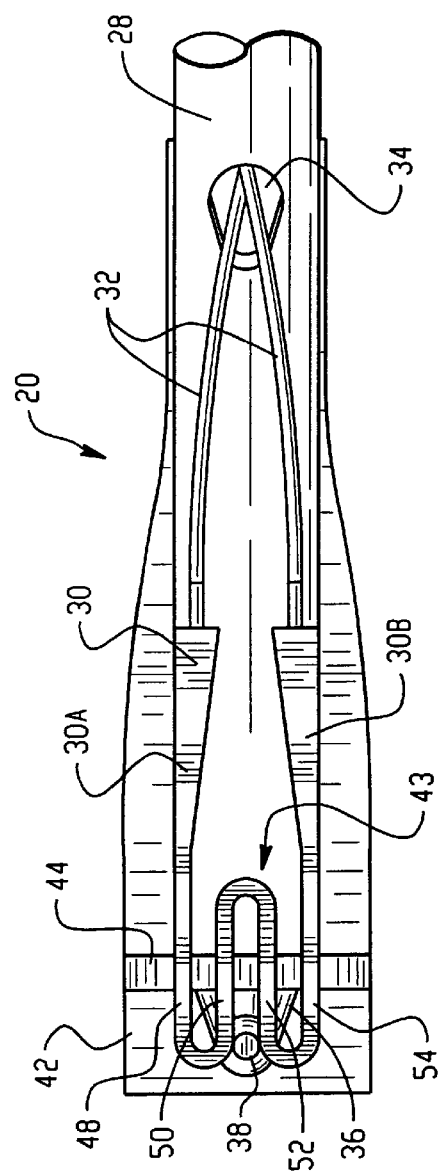

WAFER TEMPERATURE MONITORING DEVICE UTILIZING FLEXIBLE THERMOCOUPLE

FIELD OF THE INVENTION

The present invention relates generally to devices for monitoring the temperature of a substrate such as a semiconductor wafer, and more specifically to such a device utilizing a flexible thermocouple and structure for conforming the thermocouple to the substrate surface.

BACKGROUND OF THE INVENTION

Many industrial processes use the application of heat to process materials. Such examples are commonly found in the semiconductor industry, wherein silicon wafers to be processed are positioned within an enclosed chamber where they are heated by some appropriate technique, such as infrared irradiation. In one form, such a semiconductor processing chamber is constructed at least partially of an optically transparent material. Lamps outside of the chamber direct energy through the transparent material onto the surface of the wafer. The wafer is heated through absorption of the thermal radiation. The heated wafer may also be treated by introducing appropriate gases into the chamber which react with the heated wafer surface.

Such processes require that the temperature of the wafer be maintained within narrow limits in order to obtain good processing results. Thus, some form of temperature monitoring technique is required. One method is to contact the wafer with a conventional thermocouple assembly, which provides wafer surface temperature feedback.

U.S. Pat. No. 5,356,486 to Sugarman, et al. discloses such a thermocouple assembly. The thermocouple assembly is used to both support the wafer and urge the thermocouple into contact with the wafer. Thermocouple assemblies such as that shown in the '486 Patent, however, do not provide sufficient degrees of freedom to allow the thermocouple to adequately contact the wafer to provide an accurate temperature feedback signal.

For example, the '486 Patent discloses several different embodiments of support structures for urging the thermocouple into contact with the underside of the wafer, each of which is fixed in position with respect to a support arm on which it is mounted. Such a construction may result in poor temperature feedback from the wafer through the thermocouple. In fact, thermocouple temperature feedback devices are sometimes rejected in favor of other temperature feedback mechanisms, such as optical pyrometry, if the thermal contact between the wafer and the thermocouple is inadequate. However, optical pyrometry does not provide adequate temperature feedback when lower temperatures are monitored. Thus, direct contact methods of temperature feedback using thermocouples continue to be favored in the low temperature regime.

Accordingly, it is an object of the present invention to provide a thermocouple assembly for use in providing temperature feedback of a surface such as a semiconductor wafer, wherein the assembly provides a thermocouple support structure that permits contact of the thermocouple with the wafer in a manner that overcomes deficiencies in the prior art.

SUMMARY OF THE INVENTION

A thermocouple support arm assembly is provided, comprising (i) an arm extending longitudinally along a first axis X and having a thermocouple extending therefrom; (ii) an anvil supported by the arm and at least partially occupying a plane defined by a second axis Y and a third axis Z, the anvil positioned below the thermocouple; and (iii) a mounting mechanism for mounting the anvil on the arm such that the anvil is permitted three degrees of rotational freedom with respect to the arm along, respectively, axes X, Y and Z. When a substrate such as a semiconductor wafer is positioned above the thermocouple, to at least partially rest upon the thermocouple and the anvil, the anvil will rotate with respect to the arm along the axes X, Y and Z to force the thermocouple into intimate contact with the substrate. Minimal Y axis rotation is required as it is a function of the wafer placement with respect to the processing chamber assembly.

The anvil is constructed from a thermally insulative plastic. The thermocouple is constructed of a flexible foil that elastically deforms to conform to the underside of the substrate, when the anvil forces the thermocouple into contact with the substrate, to provide a plurality of contact points between the thermocouple and the substrate. A generally planar radiation shield member may be provided extending from the support arm and located below the anvil. The underside of the shield member may be coated with a reflective material such as platinum.

BRIEF DESCRIPTION OF THE DRAWINGS

FIG. 1 is a perspective view of a semiconductor wafer processing chamber incorporating therein a thermocouple support arm assembly constructed according to the principles of the present invention;

FIG. 2 is a side view of the thermocouple support arm assembly partially shown in FIG. 1;

FIG. 5 is a partial plan view of the thermocouple support arm assembly shown in FIG. 4, taken along the lines 5—5.

DETAILED DESCRIPTION OF A PREFERRED EMBODIMENT OF THE INVENTION

Figure 3:
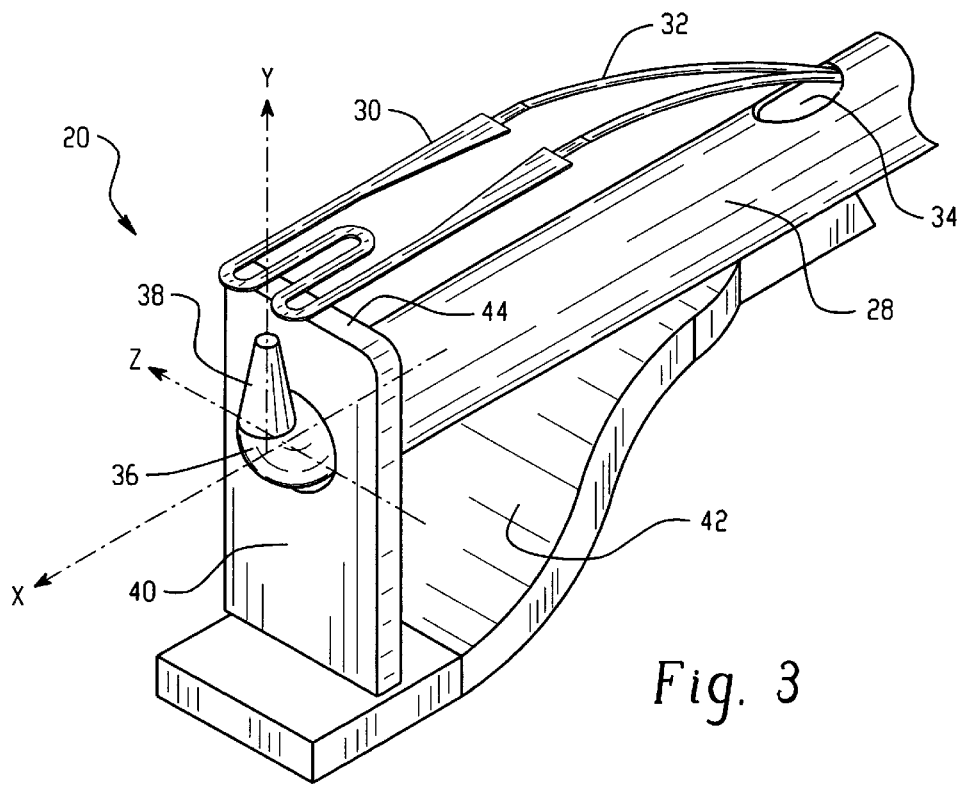
FIG. 3 is a partial perspective view of the thermocouple support arm assembly shown in FIG. 2.

Referring now to FIG. 1 of the drawings, one embodiment of the present invention is shown, wherein the invention is incorporated into a semiconductor wafer processing device 10. The device 10 comprises a walled structure 12 forming a processing chamber 14 therein. Semiconductor wafers (not shown) undergo processes within the chamber 14 that require accurate temperature measurement of the wafer surface. Although the invention is described herein in terms of its applicability to semiconductor wafer temperature monitoring, it is contemplated that the temperature of other substrates may be monitored using the invention, e.g., flat panel displays or the like.

As shown in FIG. 1, a wafer may be supported within chamber 14 on supports 16, 18 and 20, each of which is positioned approximately 120° apart from each other about the periphery of the generally cylindrical chamber 14. Supports 16 and 18 are pins that are fixed in position within the chamber. The other support takes the form of thermocouple support arm assembly 20, constructed according to the principles of the present invention.

As shown more clearly in FIG. 2, the thermocouple support arm assembly 20 comprises a body 22 into which wiring 24 is routed via entry tube 26, and from which extends support arm 28. The wiring 24 is connected to a flexible thermocouple 30, the leads 32 of which extend out of a hole 34 in support arm 28 (see FIGS. 3–5).

Figure 4:
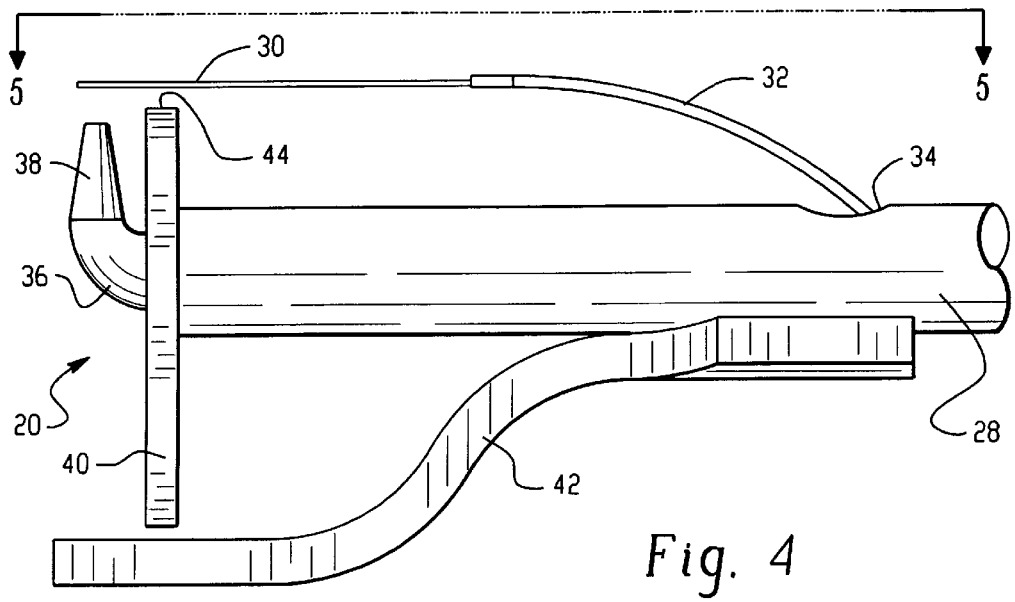
FIG. 4 is a partial side view of the thermocouple support arm assembly shown in FIG. 2.

As shown in FIG. 2, and in more detail in FIG. 3, extending from the distal end of the support arm 28 is a post 36 having a tapered end 38. A generally planar anvil 40 having a hole with a diameter slightly larger than that of the post 36 is installed over the post.

The anvil 40, as further explained below, is adapted to move with respect to the fixed position post to urge the thermocouple into contact with a wafer seated thereupon. A planar shield member 42, not connected to the anvil 40, extends from the underside of support arm 28. The shield member 42 protects the underside of the wafer from radiant sources of heat located below the support arm 28. (As used herein, "under", "underside" or "below" shall mean in a direction toward the bottom of FIGS. 2–4, and "above", "over" or "atop" shall mean in a direction toward the top of these Figures.)

The generally planar anvil 40 is designed to pivot upon the post 36 to permit three degrees of freedom of movement. Specifically, with reference to FIG. 3, the anvil can pivot or rotate, within a limited range, about the X, Y and Z axes. The X axis extends in a longitudinal direction along the axis of the support arm 28, and the Y and Z axes lie in the plane of the planar anvil 40.

The thermocouple is constructed of a highly conductive foil having a thickness of approximately 0.0005" (one-half mil). The foil comprises two different types of metals (a bi-metal construction) each forming a portion (30A and 30B) of the thermocouple, meeting at a thermocouple junction 43 (see FIG. 5). Such a thermocouple junction is referred to as a type K junction.

In operation, a wafer is supported within the process chamber 14 of FIG. 1 upon supports 16 and 18 and thermocouple support arm assembly 20. The position of the thermocouple support arm assembly 20 may be adjusted toward or away from the center of the chamber (in a direction along axis X shown in FIG. 3) to accommodate differently sized wafers while providing for the same contact pressure at the location of the anvil 40 regardless of wafer size. The underside or lower portion of the anvil 40 is weighted, such that the center of mass of the anvil lies below the post 36. As such, the weight of the wafer forces the position of the anvil to move about the X, Y and Z axes to most closely approximate the surface of the underside of the wafer.

Accordingly, a top planar surface 44 (See FIGS. 3 and 5) of the anvil 40 aligns itself co-planarly with the plane of the underside of the wafer, to press the thermocouple 30 into intimate contact with the wafer. Intimate contact may be maintained, independent of inconsistencies in wafer handling mechanisms, assembly tolerances, wafer surface irregularities, misalignment of the wafer and the thermocouple, or warpage of the wafer during heated conditions. Such heated conditions may be provided, for example, by an array of radiant heating lamps located underneath the wafer. In this manner, a low mass, thermally conductive path is provided between the wafer and the thermocouple junction 43 via the foil portions 30A and 30B.

The thermocouple 30, having a W-shape as shown in FIG. 5, will maintain four separate contact points (48, 50, 52, 54) with the wafer underside. It is not required, nor necessarily desirable, that the thermocouple junction 43 be positioned precisely or directly between the wafer and the anvil 40. The thermocouple will elastically deform due to the high contact pressure at these locations, and conform to the wafer as the planar surface 44 of the anvil 40 aligns with the wafer underside.

The anvil 40 is constructed of a highly thermally insulative plastic to prevent conduction of heat away from the foil thermocouple 30. In addition, the shield member 42 protects both the underside of the anvil 40 and the thermocouple 30 from heat emanating from underneath the wafer. The underside of the shield member 42 may be coated (e.g., by sputtering) with a highly reflective coating to enhance the shielding function. In embodiments of the present invention wherein no shield member is provided, the underside of the anvil 40 (opposite planar surface 44) may be coated with, for example, platinum, to provide the shielding function.

Accordingly, a preferred embodiment of a wafer temperature monitoring device has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

I claim:

1. A thermocouple support arm assembly (20), comprising:

an arm (28) extending longitudinally along a first axis (X) and having a thermocouple (30) extending therefrom;

an anvil (40) supported by said arm (28) and at least partially occupying a plane defined by a second axis (Y) and a third axis (Z), said anvil positioned below said thermocouple; and a mounting mechanism (36) for mounting said anvil (40) on said arm (28) such that said anvil (40) is permitted three degrees of rotational freedom with respect to said arm along, respectively, axes X, Y and Z;

wherein when a substrate is positioned above said thermocouple (30) to at least partially rest upon said thermocouple and said anvil (40), said anvil moves with respect to said arm (28) along said axes (X, Y, Z) to force said thermocouple into contact with said substrate.

2. The thermocouple support arm assembly (20) of claim 1, further comprising a generally planar shield member (42) extending from said support arm (28) and located below said anvil (40).

3. The thermocouple support arm assembly (20) of claim 2, wherein the underside of said shield member (42) is coated with a reflective material of platinum.

4. The thermocouple support arm assembly (20) of claim 2, wherein said thermocouple (30) is constructed of a flexible foil that elastically deforms to conform to the underside of the substrate when said anvil forces said thermocouple into contact with the substrate.

5. The thermocouple support arm assembly (20) of claim 4, wherein said substrate is a semiconductor wafer.

6. The thermocouple support arm assembly (20) of claim 4, wherein said flexible foil thermocouple (30) contacts said anvil (40) at a plurality of separate contact points (48, 50, 52, 54).

7. The thermocouple support arm assembly (20) of claim 4, wherein said mounting mechanism comprises a tapered post (36) extending from said arm (28).

8. The thermocouple support arm assembly (20) of claim 7, wherein said anvil is a generally planar member the underside of which is weighted such that the center of mass of the anvil lies below the post (36).

9. The thermocouple support arm assembly (20) of claim 8, wherein said anvil (40) is made of a thermally insulative plastic.

10. The thermocouple support arm assembly (20) of claim 9, wherein said anvil (40) is provided with a generally planar surface (44) that aligns wi th the underside of the wafer.

11. A method of monitoring the temperature of a substrate, comprising, the steps of:

providing a thermocouple support arm assembly (20), comprising (i) an arm (28) extending longitudinally along a first axis (X) and having a thermocouple (30) extending therefrom; (ii) an anvil (40) supported by said arm (28) and at least partially occupying a plane defined by a second axis (Y) and a third axis (Z), said anvil positioned below said thermocouple; and a mounting mechanism (36) for mounting said anvil (40) on said arm (28) such that said anvil (40) is permitted three degrees of rotational freedom with respect to said arm along, respectively, axes X, Y and Z; and positioning a substrate above said thermocouple (30) to at least partially rest upon said thermocouple and said anvil (40), allowing said anvil to move with respect to said arm (28) along said axes (X, Y, Z) to force said thermocouple into contact with said substrate.

12. The method of claim 11, further comprising the step of providing a generally planar shield member (42) extending from said support arm (28) and located below said anvil (40).

13. The method of claim 12, further comprising the step of coating the underside of said shield member (42) with a reflective material of platinum.

14. The method of claim 12, wherein said thermocouple (30) is constructed of a flexible foil that elastically deforms to conform to the underside of the substrate when said anvil forces said thermocouple into contact with the substrate.

15. The method of claim 14, wherein said substrate is a semiconductor wafer.

16. The method of claim 14, wherein said flexible foil thermocouple (30) contacts said anvil (40) at a plurality of separate contact points (48, 50, 52, 54).

17. The method of claim 14, wherein said mounting mechanism comprises a tapered post (36) extending from said arm (28).

18. The method of claim 17, wherein said anvil is a generally planar member the underside of which is weighted such that the center of mass of the anvil lies below the post (36).

19. The method of claim 18, wherein said anvil (40) is made of a thermally insulative plastic.

20. The method of claim 19, wherein said anvil (40) is provided with a generally planar surface (44) that aligns with the underside of the wafer.

* * * * *